United States Patent [19]

Sunnarborg

[11] 4,176,315

[45] Nov. 27, 1979

[54] MINIATURE ELECTRICAL VOLTAGE AND CONTINUITY TESTER WITH CIRCUIT COMPARTMENT AND TEST LEAD COMPARTMENT CASING

[76] Inventor: Earl D. Sunnarborg, Star Rte. 4, Box 1, Hibbing, Minn. 55746

[21] Appl. No.: 904,784

[22] Filed: May 11, 1978

[51] Int. Cl.² .................. G01R 1/04; G01R 31/02
[52] U.S. Cl. .................................. 324/156; 324/51; 324/133; 324/149; 361/399
[58] Field of Search ............... 324/51, 53, 73 R, 72.5, 324/115, 133, 149, 156; 361/399

[56] References Cited

U.S. PATENT DOCUMENTS

| | | | |
|---|---|---|---|
| 2,586,203 | 2/1952 | Boyle | 324/149 X |
| 2,588,772 | 3/1952 | Sill | 324/53 |
| 3,518,538 | 6/1970 | Pruss | 324/156 X |
| 3,934,195 | 1/1976 | Shires | 324/72.5 |
| 3,987,364 | 10/1976 | MacCormack et al. | 324/156 X |
| 4,027,236 | 5/1977 | Stewart | 324/133 X |

FOREIGN PATENT DOCUMENTS 928209 11/1947 France .......................... 324/53

Primary Examiner—Gerard R. Strecker
Attorney, Agent, or Firm—Kinney, Lange, Westman and Fairbairn

[57] ABSTRACT

A miniature electrical tester provides a wide range of voltage and electrical continuity testing capabilities. A molded plastic front case has a partition which separates it into a circuit compartment and a test lead compartment. A circuit board is located in the circuit compartment, and test leads which are connected to the circuit board are stored in the test lead compartment when not in use. A molded plastic back cover has a circuit cover section which covers the circuit compartment, a test lead cover section which covers the test lead compartment, and a flexible hinge section located between the circuit and test lead cover sections. The positioning of batteries and the innerconnection of the batteries within the circuit compartment, together with the location of the remaining components of the circuit board permit the circuit board to be held securely in place by a single screw and a compression pad.

14 Claims, 7 Drawing Figures

U.S. Patent  Nov. 27, 1979  Sheet 1 of 2  4,176,315
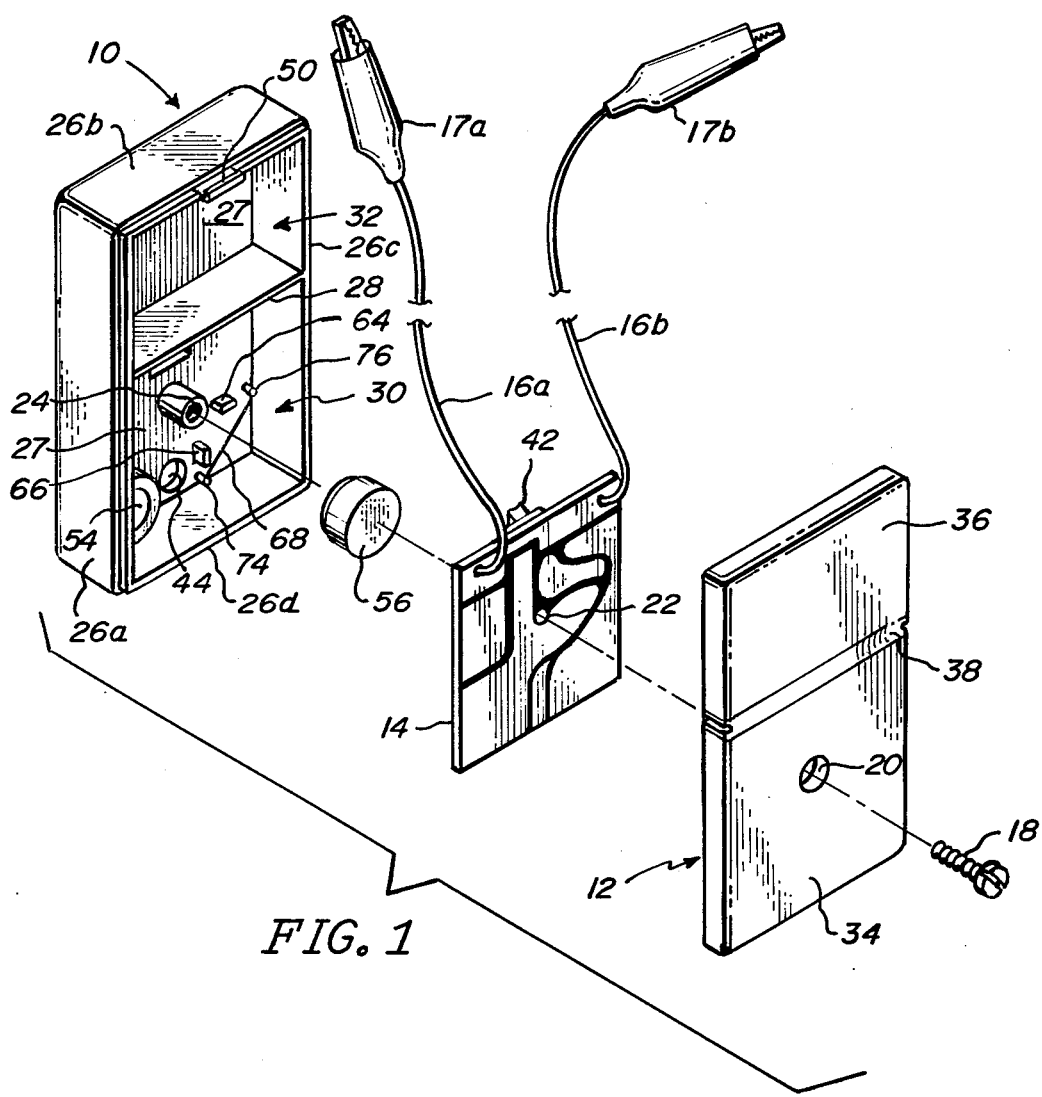
FIG. 1
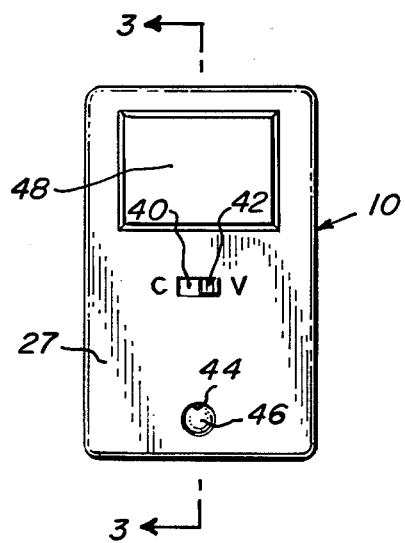
FIG. 2
FIG. 3
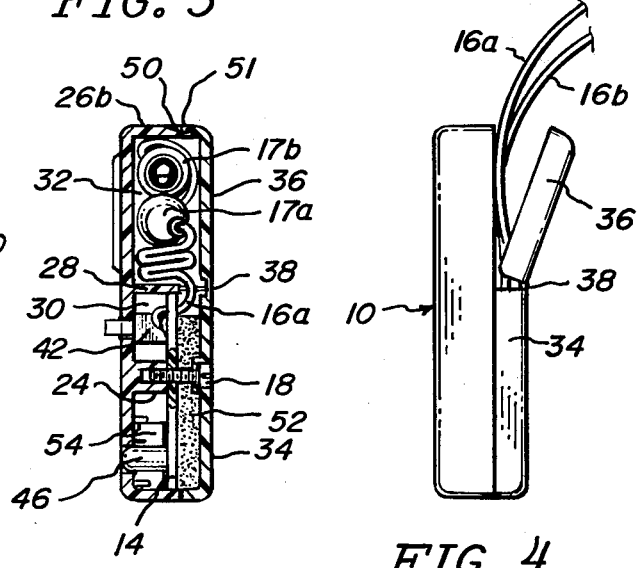
FIG. 4

MINIATURE ELECTRICAL VOLTAGE AND CONTINUITY TESTER WITH CIRCUIT COMPARTMENT AND TEST LEAD COMPARTMENT CASING

BACKGROUND OF THE INVENTION the present invention relates to electrical test equipment. In particular, the present invention is a miniature, pocket-size, electrical tester which provides a wide range of electrical testing capabilities.

Various types of electrical test equipment have been known for years. One type of test equipment which is used by an electrical trouble shooter indicates the presence of a voltage between two points of a circuit. Another useful type of test equipment indicates the presence of electrical conductivity or continuity within a circuit.

In the past, electrical test equipment for voltage and continuity testing has often been relatively expensive or bulky in size, or both. The present small, inexpensive testers available are limited to a single function such as continuity, low-voltage, or high-voltage. There is a continuing need for small (preferably pocket-size) electrical testers which provide a wide range of voltage and continuity sensing capabilities.

SUMMARY OF THE INVENTION

The present invention is a miniature electrical tester which is simple in construction, strong, durable, compact, of light weight, can be manufactured at low cost, and provides a wide range of electrical testing capabilities. In a preferred embodiment, the electrical tester senses the presence of a voltage within a range of 1 to 240 volts AC/DC, and electrical continuity within a range of 0 to 20K ohms.

The miniature electrical tester of the present invention includes a molded plastic front case, a molded plastic back cover, a circuit board, and first and second test leads. The molded plastic front case has a front wall, four side walls, and a partition which separates the case into a circuit compartment and a test lead compartment. On an inner surface of the front case are a plurality of bosses and a plurality of holding pins. The bosses hold a plurality of batteries in position in the circuit compartment, and the holding pins hold a battery innerconnecting wire in position in the circuit compartment.

The circuit board supports and connects the electrical circuit components into testing circuitry. These components include an indicator light which is controlled by the testing circuitry. The indicator light is exposed through an aperture in the front wall of the front case when the circuit board is in position. The circuit board also includes battery contacts for making electrical connection between the batteries and the circuit board.

The first and second test leads are connected to the circuit board. When in use, the first and second test leads connect an input to the test circuitry. When they are not in use, the first and second test leads are stored in the test lead compartment.

The molded plastic back cover has a circuit cover section which covers the circuit compartment, a test lead cover section which covers the test lead compartment, and a flexible hinge section located between the circuit and test lead cover sections. The flexible hinge section essentially covers the partition of the molded plastic front piece.

Compression pad means is located between the circuit cover section and the circuit board. When a screw holds the circuit cover in position, the compression pad means holds the circuit board in position with the battery contacts in electrical and physical contact with the batteries. Latch means releasably holds the test lead cover section in closed position covering the test lead compartment. The latch means is released when the user wishes to open the test lead compartment and remove the first and second test leads.

BRIEF DESCRIPTION OF THE DRAWINGS

FIG. 1 is an exploded perspective view showing the preferred embodiment of the miniature electrical tester of the present invention.

FIG. 2 is a front view of the miniature electrical tester.

FIG. 3 is a cross-sectional view taken along line 3—3 of FIG. 2.

FIG. 4 is a side view of the miniature electrical tester with the test cover section of the back cover open and the test leads extending out of the test lead compartment.

DETAILED DESCRIPTION OF THE PREFERRED EMBODIMENT

Figure 5:
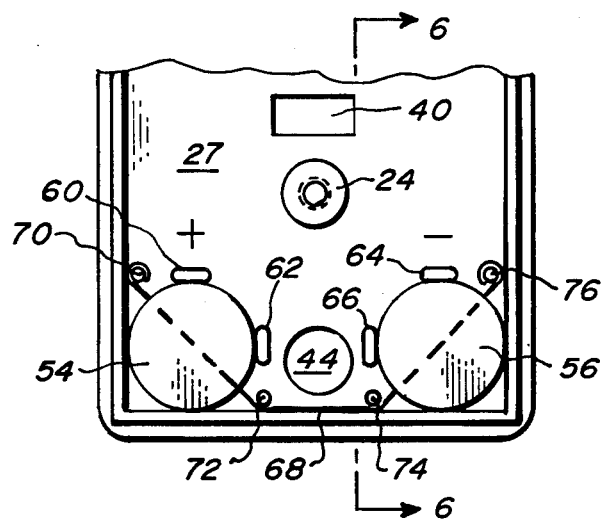
FIG. 5 is a detailed view showing a portion of the circuit compartment of the molded plastic front case.

FIG. 1 shows an exploded view of a preferred embodiment of the present invention which is a highly desirable, convenient, and handy electrical tester of extremely small size. In a preferred embodiment, this electrical tester has total dimensions of $\frac{5}{8}''\times1\frac{1}{2}''\times2\frac{1}{2}''$ and weighs approximately one ounce. Despite this extremely small size, the tester is capable of indicating the presence of voltage within a range of 1 to 240 volts AC/DC and indicating electrical continuity within a range of 0 to 20K ohms.

As shown in FIG. 1, the electrical tester includes front case 10, back cover 12, circuit board 14, and test leads 16a and 16b. Alligator type clamps 17a and 17b are attached to the ends of test leads 16a and 16b, respectively. The entire assembly is held together by a single screw 18, which extends through hole 20 in back cover 12, hole 22 in circuit board 14, and into screw post 24 which is an integral part of front case 10.

Front case 10, which is preferably a molded high-impact plastic, has four side walls 26a-26d, front plate 27, and internal partition 28. As a result, front case 10 is divided into a circuit compartment 30 and a test lead compartment 32.

Back cover 12, which is also preferably a molded high-impact plastic, includes a circuit cover section 34, a test lead cover section 36, and a hinge section 38. Circuit cover section 34 covers circuit compartment 30 when the tester is assembled. Similarly, test lead cover section 36 covers test lead compartment 32. Flexible hinge section 38, which is of a lesser thickness than sections 34 and 36, is positioned to cover partition 28. Because circuit cover section 34 is mounted securely by screw 18, while test lead cover section is not similarly attached, test lead cover 36 can be pivoted about hinge section 38 to cover test lead compartment 32 or to permit the test leads to extend out of the compartment.

FIG. 2 shows a front view of front case 10. As shown in FIG. 2, front panel 27 includes an aperture 40 through which switch 42 is exposed, and an aperture 44 through which indicator light 46 is exposed. Both switch 42 and indicator light 46 are mounted on the front side of circuit board shown in FIG. 1.

Switch 42 is preferably an inexpensive single pole double throw function switch which enables the user to select either a continuity testing or a voltage testing function. Molded in the front surface of front panel 27 on opposite sides of switch aperture 40 are the letters "C" and "V". These two letters indicate which function is being selected depending upon the position of switch 42. Also shown in FIG. 2 is a front cover plate 48 on which the product name may be printed or label affixed.

FIG. 3 is a cross-sectional side view which illustrates the tester of the present invention with the test leads in test compartment 32 and test lead cover section 36 closed. FIG. 4 is a side view of the tester which illustrates the tester when cover section 36 is in an open position and test leads 16a and 16b are extending out of the test compartment. FIG. 4 illustrates a position that the cover section 36 may be in when the tester is in actual use.

As also shown in FIG. 3, test leads 16a and 16b extend over partition 28 from circuit compartment 30 to test lead compartment 32. Test leads 16a and 16b extend through holes in circuit board 14 from the back side to the front side of circuit board 14. The actual connection of leads 16a and 16b occurs on the front side of circuit board 14. This provides stress relief for test leads 16a and 16b without any special fittings.

It should be noted that leads 16a and 16b must cross over partition 28 to reach rest lead compartment 32. The reduced section of hinge section 38 which lies opposite partition 28, permits the necessary feed through of test leads 16a and 16b even when test lead cover section 36 is closed. As a result, no special tooling or fittings are required.

A snap type latch holds cover section 36 closed until released by the user. The latch includes lip 50 which projects from side wall 26b and cooperating groove 51 in the inner upper edge of test lead cover section 36.

The unique placement of parts within the tester provides reliable connection to the batteries and location of the circuit board in place with a single screw 18. A compression pad 52, which is preferably foam rubber or plastic, is attached to the inside of cover section 34 and applies pressure to the back side of circuit board 14 when the tester is assembled. Because all circuit components are mounted on the front side of circuit board 14, the compression pad can be extremely simple and low cost.

Figure 6:
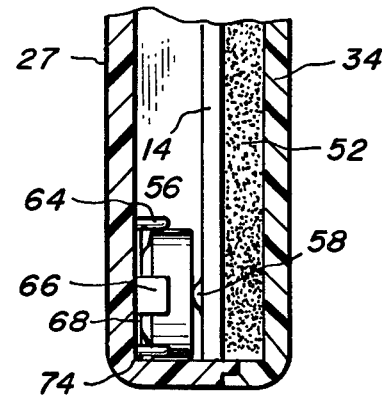
FIG. 6 is a sectional view of the circuit compartment taken along line 6—6 of FIG. 5.

The locating and holding of circuit board 14 in place is provided by batteries 54 and 56, together with either switch 42 or post 24. As shown in FIGS. 5 and 6 (and also in FIG. 1), batteries 54 and 56 are located in the opposite lower corners of compartment 30. Circuit board 14 has plated battery lead-through bumps 58 which contact batteries 54 and 56 and provide the electrical connection of circuit board 14 to batteries 54 and 65. In addition, the contacting of battery contact lead-throughs 58 with batteries 54 and 56 provides two points of support for circuit board 14. A third point of support may be provided by a front shoulder of switch 42 engaging the inside surface of front plate 27. Additionally, circuit board 14 may also rest securely against screw post 24. The three point plane of contact assures good battery contact with a single, simple, and economical foam rubber of plastic compression pad 52, and without special spring contacts which would increase the cost of the tester.

FIG. 5 illustrates the unique manner in which the batteries are connected and held in location. Bosses 60 and 62 project from the inner surface of front plate 27 to hold battery 54 in location in one lower corner of circuit compartment 30. Similarly, bosses 64 and 66 hold battery 56 in location in the lower corner of compartment 30. The interconnection of batteries 54 is provided by battery interconnect wire 68. Four small pegs 70, 72, 74, and 76, which are each spaced a fixed distance from a side wall of case 10, provide a force fit for battery interconnecting wire 68. As a result, an economical tin-plated wire can be used to interconnect batteries 54 and 56. No special stamp-formed parts are required.

In the preferred embodiment shown in the FIGS., batteries 54 and 56 are 1.4 to 1.5 volt batteries such as Eveready S76 or E675E. The "+" terminal of battery 54 and the "−" terminal of battery 56 contact battery inter connect wire 68, so that the batteries are connected in series. The "−" terminal of battery 54 and the "+" terminal of battery 56 contact lead-through contact bumps 58.

Figure 7:
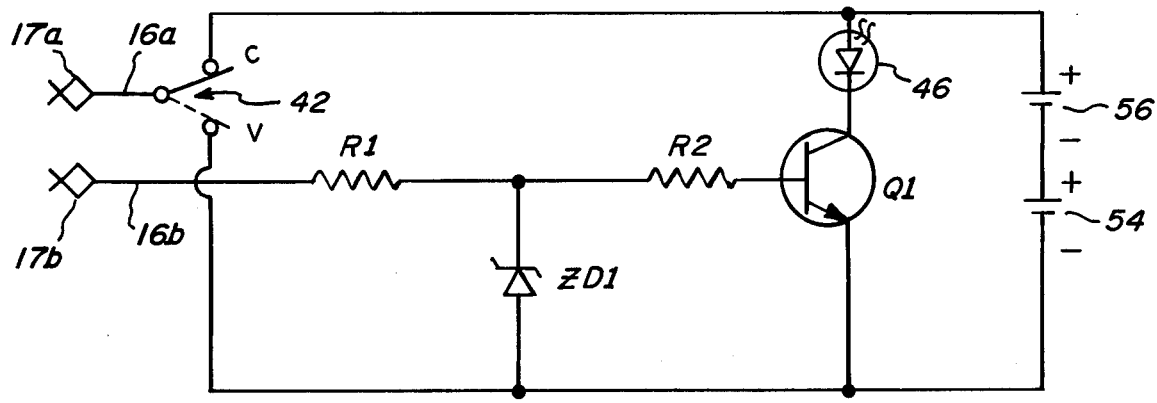
FIG. 7 is an electrical schematic of the test circuitry of the miniature electrical tester.

FIG. 7 illustrates an electric schematic diagram of a preferred embodiment of the electronic circuitry used in the miniature electronic tester. It can be seen that the electronic circuitry is extremely simple and inexpensive, while providing satisfactory results over a wide range of voltage and continuity testing conditions.

The circuit shown in FIG. 7 includes test leads 16a and 16b, alligator-type clamps 17a and 17b, indicator light 46, batteries 54 and 56, resistors R1 and R2, zener diode ZD1, and transistor Q1. Indicator light 46 is a light emitting diode which is lit when transistor Q1 is turned on. In the voltage sensing mode, transistor Q1 is turned on when a voltage appears between test leads 16a and 16b. In the continuity mode, transistor Q1 (and therefore indicator light 46) will be turned on only if a sufficient current is supplied from batteries 54 and 56, through switch 42, lead 16a and clamp 17a, through the object being tested, through clamp 17b, lead 16b, resistors R1 and R2, to the base of transistor Q1. Zener diode ZD1 provides protection of the circuit against transients and overloads, and is preferably a 3.3 volt zener diode.

In conclusion, the miniature electrical tester of the present invention is simple in construction, strong, durable, compact, of light weight, and can be manufactured at very low cost. Despite its small size and simple construction, the tester has a wide range of voltage and continuity testing capabilities. The unique packaging of the tester provides these many advantages. First, the two piece construction using a front case 10 and a back cover 12 with a single screw holding the tester together permits simple and economical mold tooling.

Second, the battery holders are simple bosses 60, 62, 65, and 66 which are molded as an integral part of the front case. Similarly, pegs 70, 72, 74, and 76, which hold battery interconnecting wire 68 in place are also molded as an integral part of front case 10. Because of the unique parts configuration, interconnection of the batteries 54 and 56 can be provided by an economical tin-plated wire 68.

Third, the placement of switch 42 and battery feed-through contacts 58 provide a 3 point plane of contact with switch 42 touching the inside surface of front plate 26 and the two feed-through contacts 58 each touching a terminal of a battery 54 or 56. This assures good battery contact with a single economical and simple foam rubber or plastic compression pad 52 without special spring contacts for contacting the batteries.

Fourth, the circuit board is oriented so that test leads 16a and 16b enter from the back side and pass through holes in the board to the front side, where they are attached. This provides stress relief for test leads 16a and 16b without any special fittings.

Fifth, the integral partition 28 separates the circuit and test lead compartments 30 and 32, while the reduced thickness of hinge section over partition 28 provides the necessary feed through for leads 16a and 16b from the circuit compartment 30 to test lead compartment 32. Once again, this simplifies tooling requirements and eliminates any special fittings.

Sixth, the electronic circuitry which is employed is very simple and can be packaged in an extremely small package. Despite the simplicity and low cost, the electronic circuitry provides satisfactory results in sensing the presence of a voltage within a range of 1 to 240 volts AC or DC, and electrical continuity within a range of 0 to 20K ohms. An inexpensive single pole double throw function switch enables the user to select either the continuity testing or voltage testing function.

Although the present invention has been described with reference to preferred embodiments, workers skilled in the art will recognize that changes may be made in form and detail without departing from the spirit and scope of the invention.

What is claimed is:

1. A miniature electrical tester comprising:
   a molded plastic front case having a front wall and four side walls, a partition which separates the front case into a circuit compartment and a test lead compartment, a plurality of bosses on an inner surface of the front case for holding a plurality of batteries in position in the circuit compartment, and a plurality of holding pins on an inner surface of the front case for holding a battery interconnecting wire in position in the circuit compartment;
   a circuit board for supporting and connecting electrical circuit components into testing circuitry, the components including an indicator light which is controlled by the testing circuitry, the indicator light being exposed through an indicator light aperture in the front wall of the front case when the circuit board is in position in the circuit compartment, the circuit board further including battery contacts for making electrical connection between the batteries and the circuit board;
   first and second test leads connected to the circuit board for connecting an input to the test circuitry when in use and and which may be stored in the test lead compartment when not in use;
   a molded plastic back cover having a circuit cover section for covering the circuit compartment, a test lead cover section for covering the test lead compartment, and a flexible hinge section located between the circuit cover and test lead cover sections and essentially covering the partition;
   latch means for releasably holding the test lead cover section in closed position covering the test lead compartment;
   screw means for holding the circuit cover section in position covering the circuit compartment; and
   means between the circuit cover section and the circuit board for holding the circuit board in position with the battery contacts in contact with the batteries when the screw means holds the circuit cover section in position.

2. The miniature electrical tester of claim 1 wherein the components include a switch for selecting either a continuity or a voltage testing mode, a portion of the switch being exposed thorugh a switch aperture in the front wall.

3. The miniature electrical tester of claim 2 wherein a locating plane for the circuit board is defined by the battery contacts engaging the batteries and the switch engaging an inner surface of the front case.

4. The miniature electrical tester of claim 1 wherein the plurality of holding pins project from the inner surface of the front wall and are positioned with respect to the side walls to hold the battery interconnecting wire therebetween.

5. The miniature electrical tester of claim 1 wherein the latch means is located at an opposite end of the test lead cover section from the hinge section.

6. The miniature electrical tester of claim 5 wherein the latch means comprises a snap latch having a first portion at the end of the test lead cover section and a second, mating portion on a side wall of the front case.

7. The miniature electrical tester of claim 1 wherein the circuit board has a first side facing the front wall and a second side facing the circuit cover section of the back cover.

8. The miniature electrical tester of claim 7 wherein the test leads are connected to the first side of the circuit board, pass through holes in the circuit board, pass over the partition, and into the test lead compartment.

9. The miniature electrical tester of claim 8 wherein the flexible hinge section has a reduced thickness and is located with respect to the partition to permit the test leads to pass over the partition without obstruction when the test lead cover section is in either an open or a closed position.

10. The miniature electrical tester of claim 7 wherein the components are mounted on the first side of the circuit board and electrical interconnections of the components are provided on the second side.

11. The miniature electrical tester of claim 1 wherein the means between the circuit cover section and the circuit board comprises a compression pad.

12. A miniature electrical tester comprising:
   a molded plastic front case having a front wall and four side walls, a partition which separates the front case into a circuit compartment and a test lead compartment;
   a circuit board for supporting and connecting electrical circuit components into testing circuitry, the components being mounted on a first side of the circuit board facing the front wall and including an indicator light which is controlled by the testing circuitry, the indicator light being exposed through an indicator light aperture in the front wall of the front case when the circuit board is in position in the circuit compartment, the circuit board further including battery contacts on the first side for making electrical connection between terminals of a plurality of batteries in the circuit compartment and the circuit board; wherein a locating plane for the circuit board is at least partially defined by the battery contacts engaging the terminals of the batteries;

first and second test leads connected to the circuit board for connecting an input to the test circuitry when in use and which may be stored in the test lead compartment when not in use;

a molded plastic back cover having a circuit cover section for covering the circuit compartment, a test lead cover section for covering the test lead compartment, and a flexible hinge section located between the circuit cover and test lead cover sections and essentially covering the partition;

latch means for releasably holding the test lead cover section inclosed position covering the test lead compartment;

screw means for holding the circuit cover section in position covering the circuit compartment; and means between the circuit cover section and the circuit board for holding the circuit board in position with the battery contacts in contact with the terminals of the batteries when the screw means holds the circuit cover in position.

13. The miniature electrical tester of claim 12 wherein the test leads are connected to the first side of the circuit board, pass through holes in the circuit board, pass over the partition, and into the test lead compartment.

14. The miniature electrical tester of claim 13 wherein the flexible hinge section has a reduced thickness and is located with respect to the partition to permit the test leads to pass over the partition without obstruction when the test lead cover section is in either an open or a closed position.

* * * * *